United States Patent
Jorgensen et al.

(10) Patent No.: US 10,111,347 B2
(45) Date of Patent: Oct. 23, 2018

(54) CONTROLLER-ENCLOSURE ASSEMBLY

(71) Applicant: Magna Closures Inc., Newmarket (CA)

(72) Inventors: Gregory A. Jorgensen, Oxford, MI (US); Charles A. Mallon, Howell, MI (US); Ian G. Jorgensen, Oxford, MI (US); John G. Zeabari, Highland, MI (US)

(73) Assignee: MAGNA CLOSURES INC., Newmarket (CA)

( * ) Notice: Subject to any disclaimer, the term of this patent is extended or adjusted under 35 U.S.C. 154(b) by 366 days.

(21) Appl. No.: 14/649,442

(22) PCT Filed: Dec. 13, 2013

(86) PCT No.: PCT/IB2013/003192
§ 371 (c)(1),
(2) Date: Jun. 3, 2015

(87) PCT Pub. No.: WO2014/122497
PCT Pub. Date: Aug. 14, 2014

(65) Prior Publication Data
US 2015/0351262 A1 Dec. 3, 2015

Related U.S. Application Data

(60) Provisional application No. 61/739,990, filed on Dec. 20, 2012.

(51) Int. Cl.
*H05K 5/00* (2006.01)
*H05K 5/03* (2006.01)
(Continued)

(52) U.S. Cl.
CPC ........... *H05K 5/0043* (2013.01); *H05K 5/006* (2013.01); *H05K 5/0039* (2013.01);
(Continued)

(58) Field of Classification Search
CPC ...... H05K 5/0013; H05K 5/003; H05K 5/006; H05K 5/03; H05K 5/0017; H05K 5/0026;
(Continued)

(56) References Cited

U.S. PATENT DOCUMENTS 6,434,013 B2 * 8/2002 Kitamura ............. H05K 5/0039
174/50
7,094,075 B1 * 8/2006 Lim ..................... H01R 13/508
439/76.1

(Continued)

FOREIGN PATENT DOCUMENTS

DE     102011057192 A1 * 7/2013  .......... H05K 5/0039
JP       09117943 A      5/1997
WO   WO 2010043525 A1 * 4/2010  .......... H05K 5/0039

OTHER PUBLICATIONS

International Search Report dated Aug. 20, 2014.
Written Opinion dated Aug. 20, 2014.

*Primary Examiner* — Kimberly S Wright
(74) *Attorney, Agent, or Firm* — Dickinson Wright PLLC

(57) ABSTRACT

In an aspect, an enclosure member for a circuit board includes first, second, third, fourth and fifth walls that define an interior. The first and second walls face each other. The third and fourth walls face each other. The fifth wall faces an opening. The first and second support members face the second wall. The second support member is spaced longitudinally from the first support member. The first and second walls are spaced apart by a distance that increases towards the opening. Any surfaces in the interior that at least partially face the second wall have a distance from the second wall that does not decrease towards the opening. The interior is free of surfaces that face the fifth wall and are perpendicular to the second wall thereby preventing die lock during molding, while providing the enclosure member with first and second support members that are spaced longitudinally.

17 Claims, 14 Drawing Sheets

(51) Int. Cl.
*H05K 5/02* (2006.01)
*H05K 5/06* (2006.01)

(52) U.S. Cl.
CPC ............ *H05K 5/0217* (2013.01); *H05K 5/03* (2013.01); *H05K 5/061* (2013.01)

(58) Field of Classification Search
CPC .. H05K 5/0039; H05K 5/0043; H05K 5/0047; H05K 5/0052; H05K 5/0056; H05K 5/0217
USPC .......................................................... 361/752
See application file for complete search history.

(56) References Cited

U.S. PATENT DOCUMENTS

| | | | | |
|---|---|---|---|---|
| 7,140,885 B2* | 11/2006 | Kitamura | ............ | H05K 5/0039 439/76.1 |
| 7,144,258 B2* | 12/2006 | Ariga | ............ | H05K 5/0039 439/76.1 |
| 7,417,868 B2* | 8/2008 | Morisada | ............ | H05K 7/1405 361/741 |
| 7,686,623 B2* | 3/2010 | Honda | ............ | H05K 5/0039 439/78 |
| 7,699,622 B2* | 4/2010 | Sakamoto | ............ | H01R 13/629 439/76.1 |
| 8,207,693 B2 | 6/2012 | Hauser et al. | | |
| 8,408,945 B2* | 4/2013 | Schober | ............ | H05K 5/0039 439/660 |
| 2001/0017767 A1* | 8/2001 | Kitamura | ............ | H05K 5/0039 361/752 |
| 2005/0270753 A1* | 12/2005 | Morisada | ............ | H05K 5/0039 361/752 |
| 2005/0287841 A1* | 12/2005 | Kitamura | ............ | H05K 5/0039 439/76.1 |
| 2006/0063401 A1* | 3/2006 | Ariga | ............ | H05K 5/0039 439/76.1 |
| 2008/0180916 A1* | 7/2008 | Wickett | ............ | H05K 5/061 361/720 |

* cited by examiner

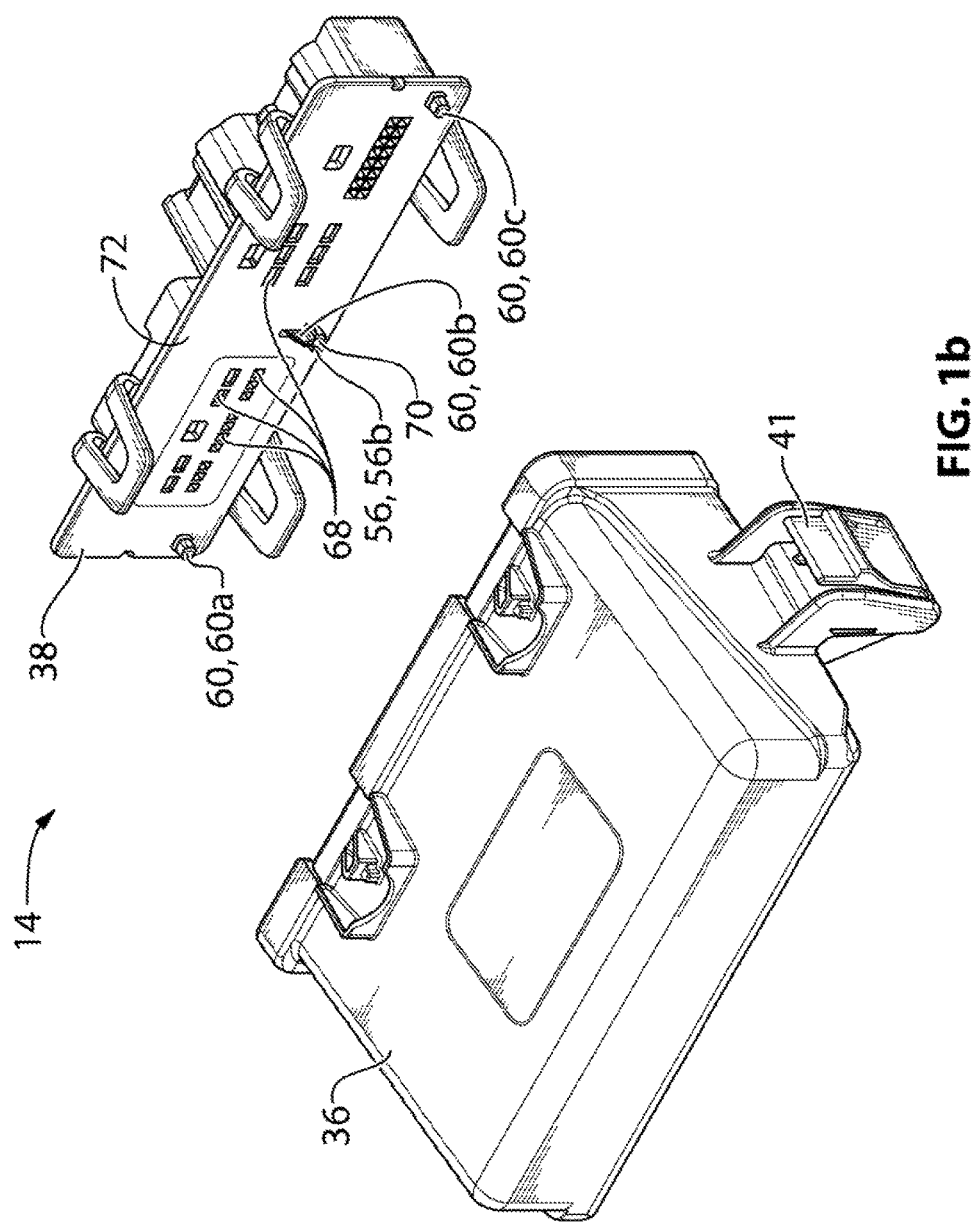

CONTROLLER-ENCLOSURE ASSEMBLY

CROSS-REFERENCE TO RELATED APPLICATIONS

This application is a National Stage of International Application No. PCT/IB2013/003192 filed Dec. 13, 2013 which claims the benefit and priority of U.S. Provisional Patent Application No. 61/739,990 filed Dec. 20, 2012. The entire disclosure of each of the above applications is incorporated herein by reference.

FIELD

This disclosure relates to controller-enclosure assemblies and more particularly to controller-enclosure assemblies for use in vehicles.

BACKGROUND

In many vehicles, controllers are provided for many purposes, such as for receiving and processing data, and controlling the operation of certain components. The controller is sometimes kept in a dedicated enclosure which is intended to protect the controller's circuit board and associated components from mechanical and environmental damage. Some such enclosures suffer from one or more of several deficiencies. For example, some enclosures do not hold the circuit board tightly and as a result, the circuit board rattles in the enclosure during operation of the vehicle, thereby generating noise, which can negatively affect the impression of quality of the vehicle to its owner. Some enclosures are not sufficiently sealed against the intrusion of water therein from rain, from condensation, or from kickup during operation of the vehicle, thereby risking damage to the circuit board. Some enclosures consume a substantial amount of surface area on the circuit board in order to hold the circuit board, thereby necessitating the use of larger-than-otherwise-necessary circuit boards in order to hold a certain number of components. This increases the cost of the circuit boards.

SUMMARY

This section provides a general summary of the disclosure, and is not a comprehensive disclosure of its full scope or all of its features.

In an aspect, an enclosure member for holding a circuit board is provided. The enclosure member has a plurality of walls including a first wall, a second wall, a third wall, a fourth wall and a fifth wall. The first and second walls face each other. The third and fourth walls connect the first and second walls to each other and face each other. The fifth wall faces an opening defined by the first, second, third and fourth walls. The plurality of walls define an interior. A longitudinal axis extends between the fifth wall and the opening. A first support member and a second support member face the second wall. The second support member is spaced longitudinally from the first support member. The first and second walls are spaced apart by a distance that increases in a direction towards the opening. Any surfaces in the interior that at least partially face the second wall have a distance from the second wall that does not decrease in a direction towards the opening. The interior is free of surfaces that face the fifth wall and are perpendicular to the second wall. As a result, the enclosure member can be molded using a single mold core that can be removed without risk of die lock, while providing the enclosure member with first and second support members that are spaced longitudinally.

In another aspect, an enclosure is provided that includes the enclosure member described above, and that further includes a second enclosure member that mates with the first enclosure member to cover the opening.

In another aspect, an enclosure is provided that includes a first enclosure member and a second enclosure. The first enclosure member includes a plurality of walls including a first wall, a second wall, a third wall, a fourth wall and a fifth wall. The first and second walls mutually face each other. The third and fourth walls connect the first and second walls to each other and mutually face each other. The fifth wall faces an opening defined by the first, second, third and fourth walls. The plurality of walls define an interior. The second enclosure member mates with the first enclosure member to cover the opening. The second enclosure member includes a plurality of apertures positioned for the pass-through of a plurality of terminals from the circuit board.

In another aspect, a method for forming an enclosure member is provided, comprising:

a) providing a mold formed from a plurality of mold plates including a mold core;

b) molding an enclosure member in the mold around the mold core, wherein the enclosure member includes a plurality of walls including a first wall and a second wall, wherein the first and second walls mutually face each other, third and fourth walls that connect the first and second walls to each other and that mutually face each other, and a fifth wall that faces an opening defined by the first, second, third and fourth walls, wherein a longitudinal axis extends between the fifth wall and the opening, wherein the plurality of walls define an interior, and wherein the enclosure member further includes a first support member and a second support member that face the second wall, wherein the second support member is positioned closer to the opening than the first support member, wherein the first and second walls are spaced apart by a distance that increases towards the opening so that there is no die lock between the mold core and the enclosure member; and c) withdrawing the mold core from the enclosure member after step b).

In yet another aspect, a controller-enclosure assembly is provided, comprising an enclosure and a circuit board. The enclosure includes a first enclosure member and a second enclosure member. The first enclosure member includes a plurality of walls including a first wall, a second wall, a third wall, a fourth wall and a fifth wall. The first and second walls mutually face each other. The third and fourth walls connect the first and second walls to each other and mutually face each other. The fifth wall faces an opening defined by the first, second, third and fourth walls. The plurality of walls define an interior. The second enclosure member that mates with the first enclosure member to cover the opening. The second enclosure member includes a plurality of apertures. The circuit board is positioned in the interior and has a plurality of terminals that pass through the apertures.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

Reference is made, by way of example only, to the attached figures, wherein:

FIG. 1b is an exploded perspective view of an enclosure that is part of the assembly shown in FIG. 1a;

FIG. 2 is a perspective view of a circuit board and part of the enclosure that are part of the assembly shown in FIG. 1a;

FIG. 3 is a perspective view of the controller that is part of the assembly shown in FIG. 1a;

FIG. 4 is a sectional side elevation view of the assembly shown in FIG. 1a;

FIG. 5 is a front elevation view of a portion of the enclosure shown in FIG. 1a;

DETAILED DESCRIPTION OF EXAMPLE EMBODIMENTS

In this specification and in the claims, the use of the article "a", "an", or "the" in reference to an item is not intended to exclude the possibility of including a plurality of the item in some embodiments. It will be apparent to one skilled in the art in at least some instances in this specification and the attached claims that it would be possible to include a plurality of the item in at least some embodiments.

Figure 1A:
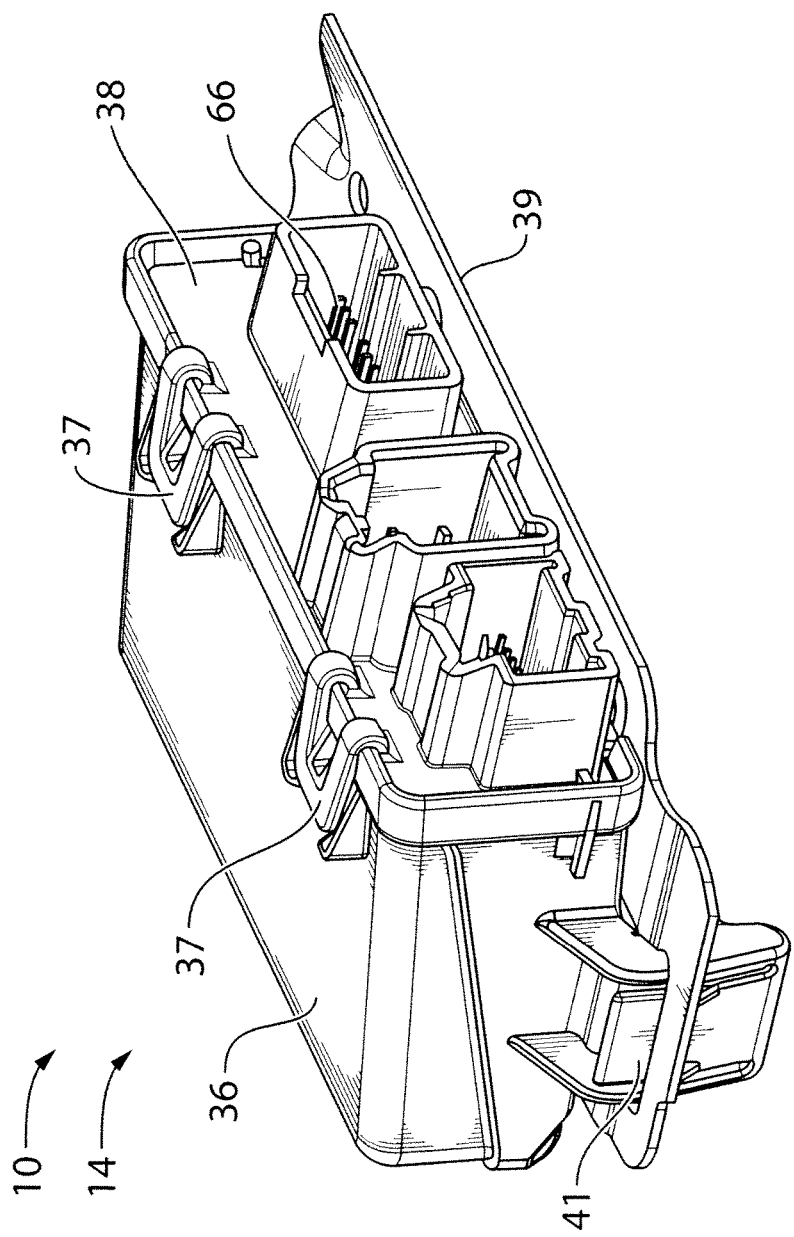
FIG. 1a is a perspective view of a controller-enclosure assembly for use in a vehicle.
Figure 2:
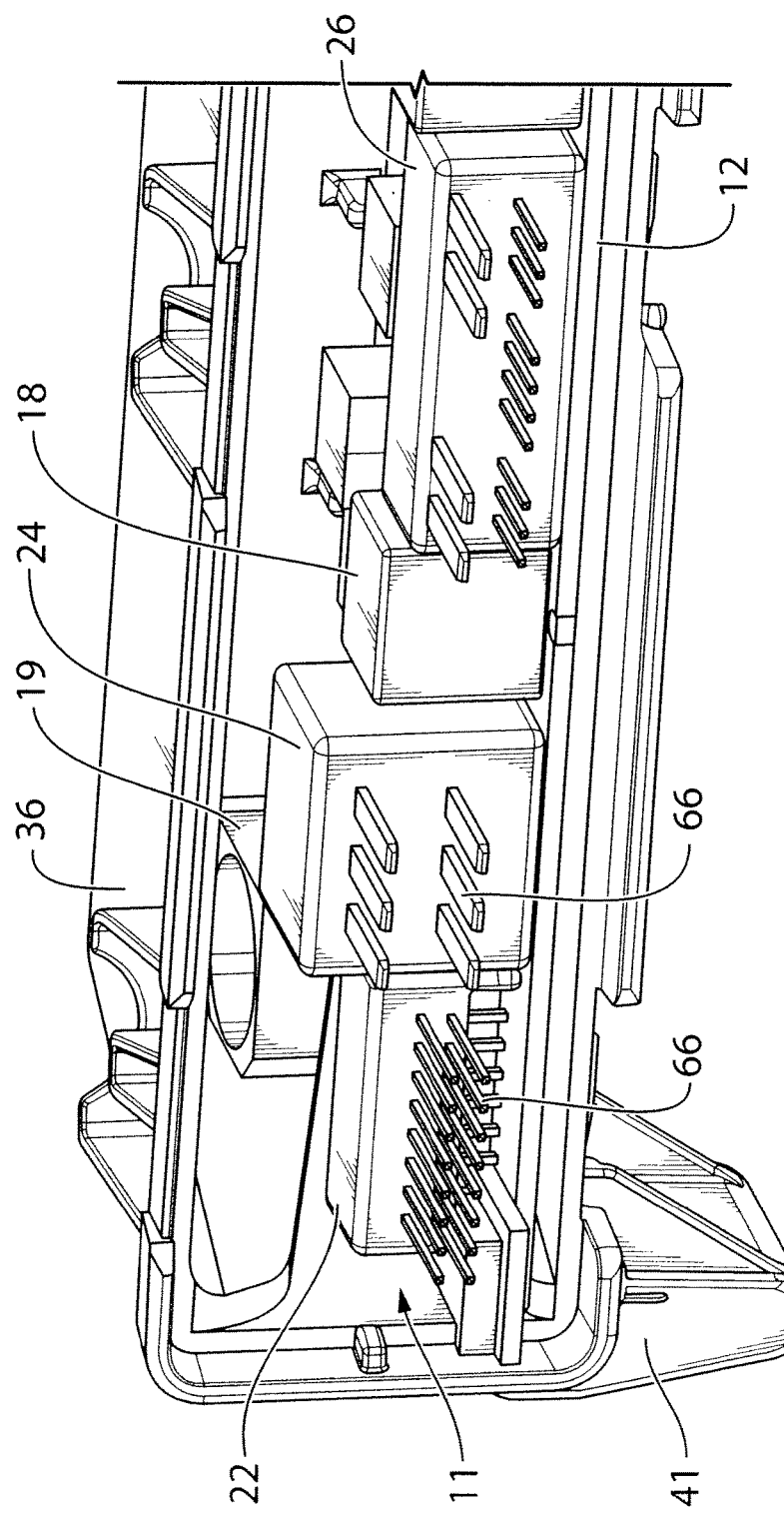
Figure 3:
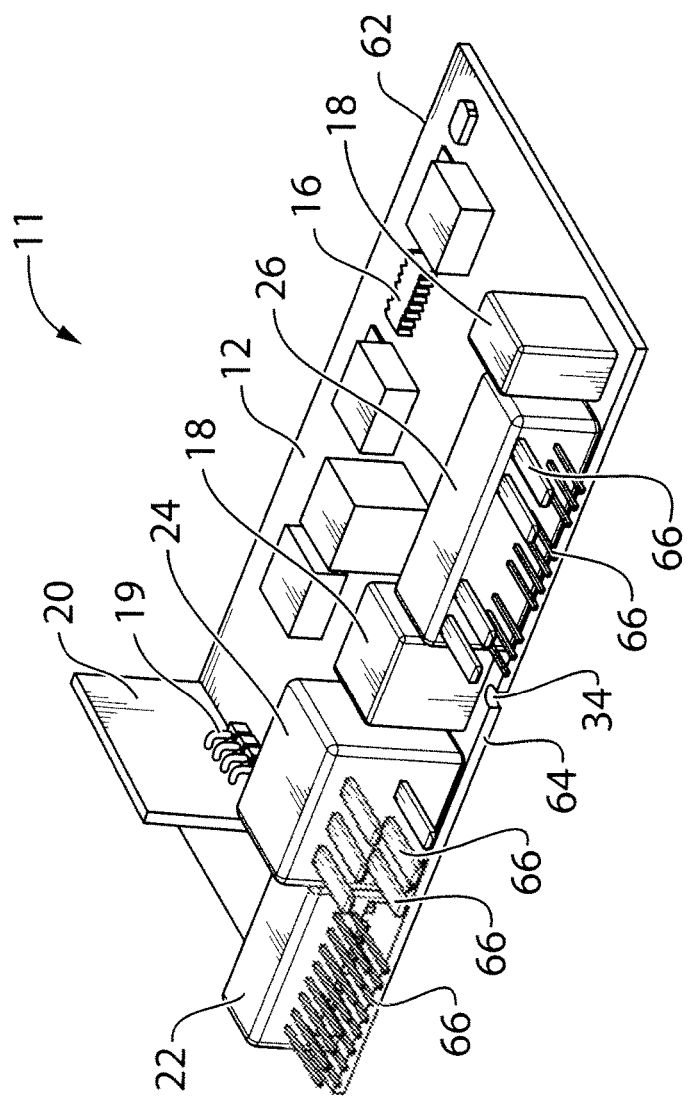

Reference is made to FIGS. 1a, 1b and 2, which shows an embodiment of an assembly 10 of a controller 11 that includes a circuit board 12 (FIG. 2) and components mounted thereto, and an enclosure 14 (FIGS. 1a and 1b). The assembly 10 may be referred to as a controller-enclosure assembly. The circuit board 12 may be any suitable type of circuit board, such as a printed circuit board and may have a plurality of components soldered thereto as shown in FIG. 3, including for example, a processor 16, relays 18, a connector 19 to a daughter board 20 and terminal blocks 22, 24 and 26, thereby forming the controller 11. The terminal blocks have terminals 66 extending therefrom which permit the connection of the controller 11 to an external power source (e.g. the vehicle's low-voltage battery system) and for communication with other devices in the vehicle. The low-voltage battery system may refer to a 12V battery system, a 42V battery system or some other voltage. The term 'low-voltage' is intended to distinguish the battery system over the high-voltage battery system found on vehicles that have an electric traction motor. For greater certainty, it will be understood that the assembly 10 may be used in vehicles that have electric traction motors and also vehicles that do not have such motors.

Figure 4:
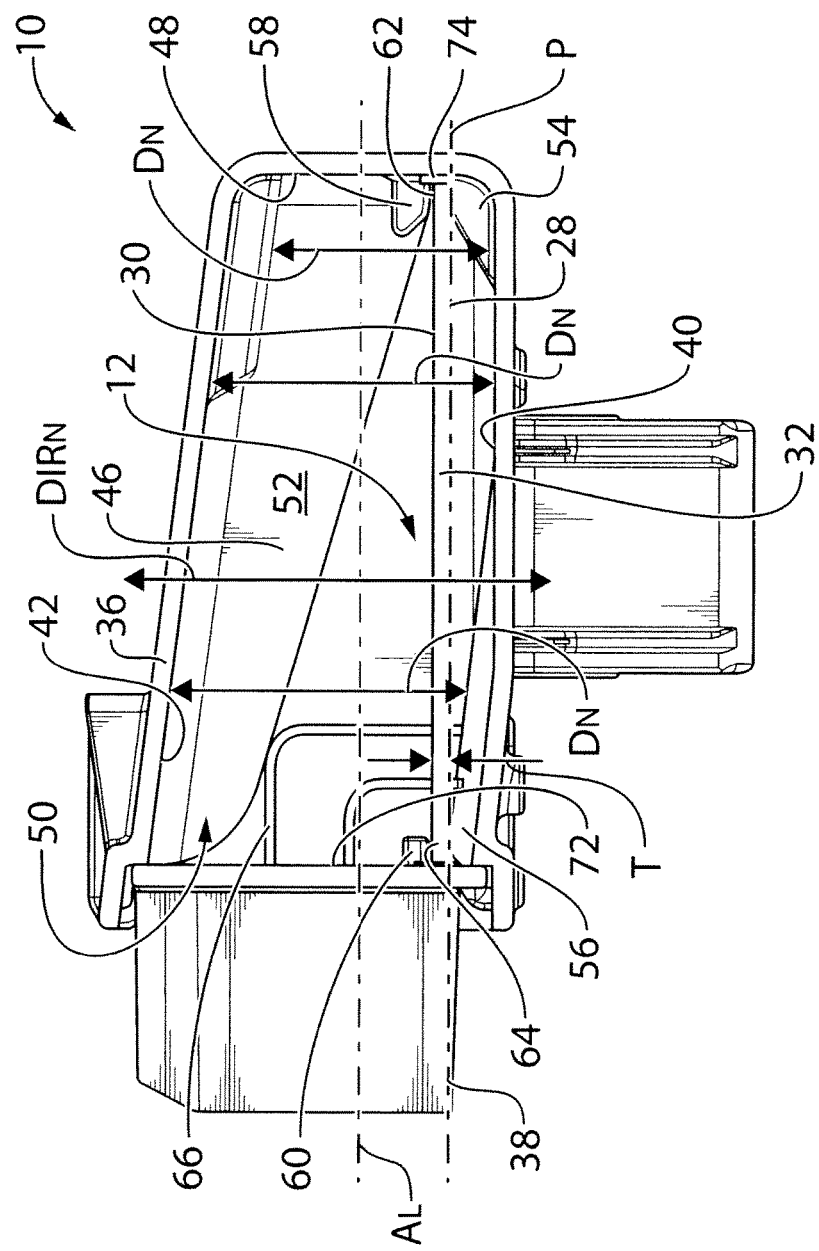

The circuit board 12 has a first face 28 and a second face 30 (FIG. 4). The components (FIG. 3) are shown as being mounted to the first face 28, however it is possible for at least some components to be mounted to the second face 30 (FIG. 4). The circuit board 12 has a peripheral edge 32 between the first and second faces 28 and 30. The circuit board 12 may have a first lateral locating feature 34 (FIG. 3) thereon that may, for example be a notch along the edge 32, and which will be described further below.

The circuit board 12 may be made from any suitable material such as an epoxy resin reinforced with glass-fibre.

Figure 5:
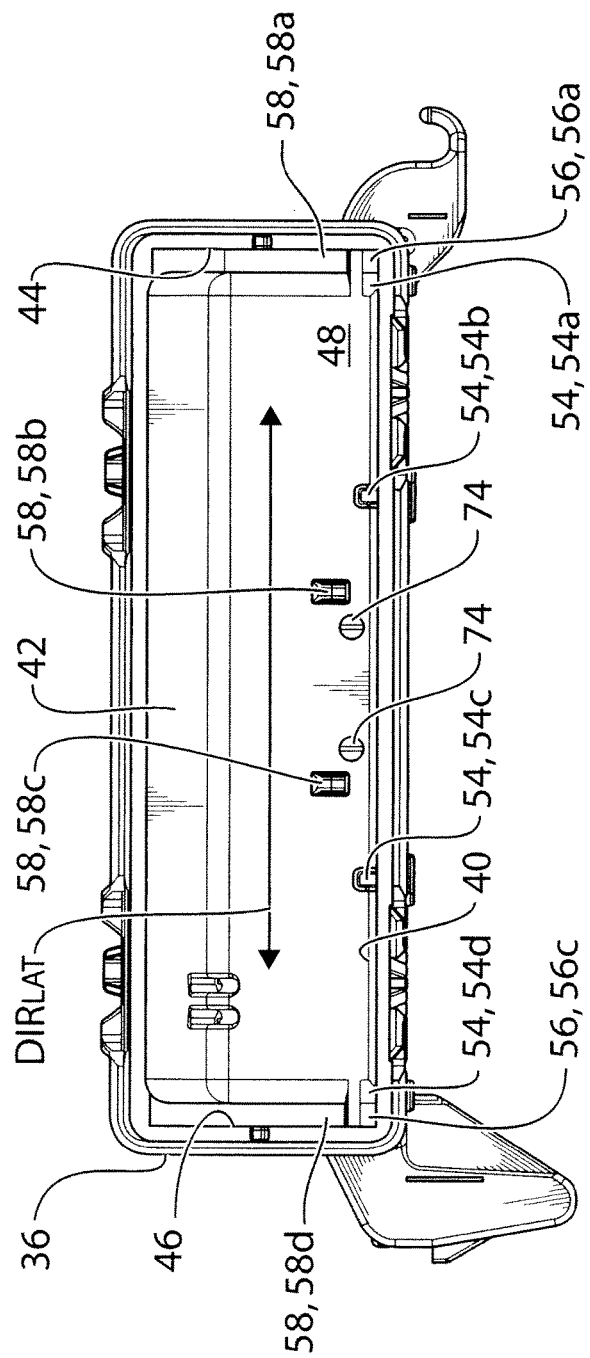
Figure 6:
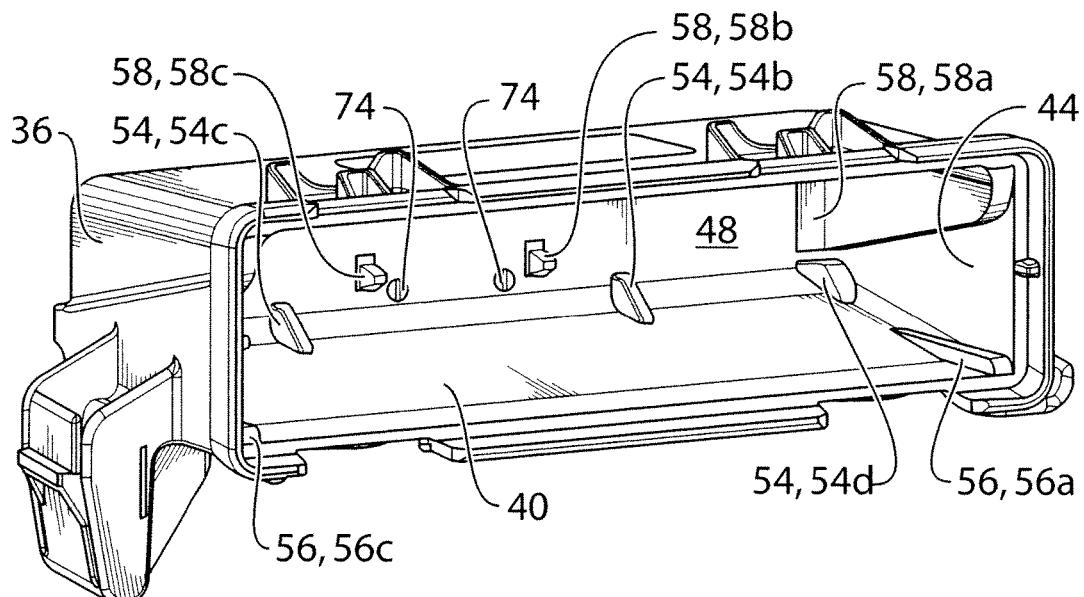
FIG. 6 is a perspective view of the portion of the enclosure shown in FIG. 5.

As shown in FIG. 1b, the enclosure 14 may include a first enclosure member 36 and a second enclosure member 38 which are connected together by a connection that may be provided by one or more snap-fit connections 37 so as to avoid the need for tools. Thus, the enclosure 14 can be assembled and disassembled without the use of tools. As shown in FIG. 1a, the enclosure 14 may mount to a bracket 39 in a vehicle by means of a snap-and-tab connector 41 on the first enclosure member 36. Referring to FIGS. 4-6, the first enclosure member 36 may include a first wall 40 and a second wall 42, wherein the first and second walls 40 and 42 generally face each other. The first enclosure member 36 further includes third and fourth walls 44 and 46 that connect the first and second walls 40 and 42 to each other and that face each other. The first enclosure member 36 further includes a fifth wall 48 that faces an opening 50 (FIG. 4) that is defined by the first, second, third and fourth walls 40, 42, 44 and 46. The walls 40, 42, 44, 46 and 48 define an interior 52.

Figure 7:
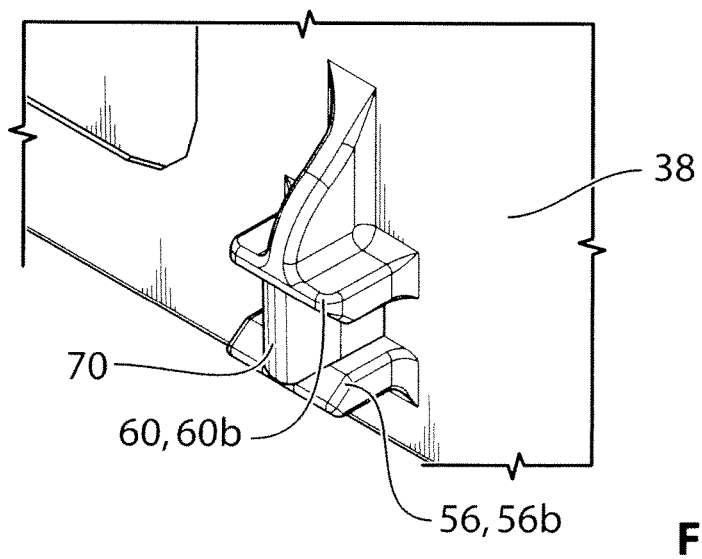
FIG. 7 is a magnified view of a portion of the enclosure shown in FIG. 1b.

The first enclosure member 36 includes four first support members 54 (FIG. 5), shown at 54a, 54b, 54c and 54d individually, two second support members 56 (FIGS. 6, 1b and 7) and shown at 56a and 56c individually, and four third support members 58, shown at 58a, 58b, 58c and 58d (FIG. 5). The first and second support members 54 and 56 face the second wall 42 and are positioned to support the first face 28 of the circuit board 12. The third support members 58 face the first wall 40 and are positioned to support the second face 30 of the circuit board 12. Three fourth support members 60 (FIG. 1b) and one second support member 56b are provided on the second enclosure member 38 (and are shown at 60a, 60b and 60c individually). The fourth support members 60 face the first wall 40 and engage the second face 30 of the circuit board 12.

The first and third support members 54 and 58 support a first end 62 (FIG. 4) of the circuit board 12 that faces away from the opening 50. The second and fourth support members 56 and 60 support a second end 64 of the circuit board 12 that is opposite the first end 62 and that faces the opening 50. The first enclosure member 36 has a longitudinal axis $A_{LONG}$ between the opening and the fifth wall 48.

The first and second support members 54 and 56 define a support plane P for the circuit board 12. At least one of the third support members 58 may be configured to be offset laterally from any first support members 54 and to be spaced from the support plane P by a distance D (FIG. 5) by not more than the LMC (least material condition) thickness of the circuit board 12. In an embodiment, at least one of the third support members 58 is spaced from the plane P by the LMC thickness of the circuit board 12. In such a case, if the actual thickness of a particular circuit board 12 (shown at T in FIG. 4) is equal to the LMC thickness then the board 12 will fit in the first enclosure member 36 without flex. If the particular circuit board 12 has a thickness that is greater than the LMC thickness then there will be some amount of flex in the board 12 when installed in the first enclosure member 36. By setting the distance D to be the LMC thickness of the board 12, flex in the board 12 is substantially minimized while ensuring that a snug fit is provided even for a board 12 that has a thickness equal to the LMC thickness.

Figure 5A:
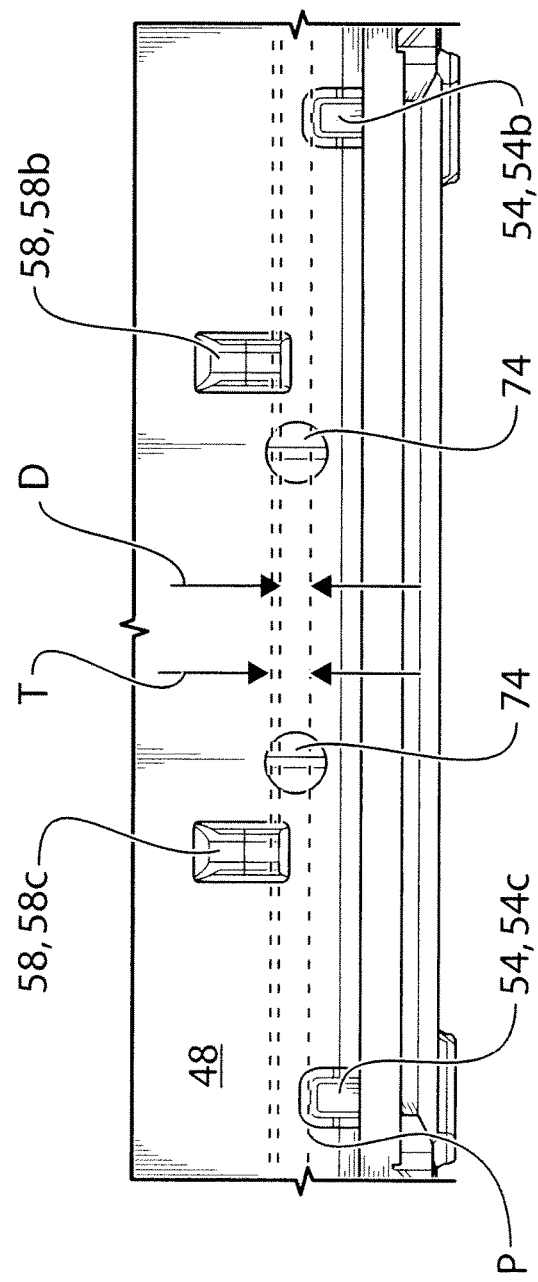
FIG. 5a is a magnified view of a portion of the portion of the enclosure shown in FIG. 5.

The term 'laterally' refers to the direction $DIR_{LAT}$ shown in FIGS. 4 and 5, which is perpendicular to the longitudinal axis $A_{LONG}$ (FIG. 4) and which is coplanar with the plane of support P. As a result of the offset and the spacing, the circuit board 12 undergoes flexing (i.e. bending) in order to fit between the first and third support members 54 and 58. By arranging the first and third support members 54 and 58 to impose a bending force on the circuit board 12, the second end 64 of the circuit board 12 is held fixedly in place and is thus prevented from rattling during operation of the vehicle. By contrast, some prior art enclosures are manufactured with support surfaces that directly face each other and are provided with sufficient clearance to ensure that even when manufactured at the limits of their tolerances, they would not form an interference fit with the circuit board captured therebetween, thereby ensuring that the support members do not damage the circuit board 12 during insertion of the circuit board 12 between the support surfaces. To ensure no interference fit, a prior art enclosure may be manufactured so that the nominal spacing between the mutually facing support surfaces is slightly larger than the thickness of the circuit board inserted therein (i.e. there is clearance between the support surfaces and the circuit board between them). As a result, the circuit board could rattle during operation of the vehicle. By imposing the aforementioned bending force on the circuit board 12 so as to fixedly capture the circuit board 12, a potential source of rattling is eliminated As shown in FIG. 5, there may be two third support members 58 that do not directly face any first support members 54 and that are positioned at a distance D away from the support plane P (shown more clearly in FIG. 5a) wherein the distance D is not more than the LMC thickness of the circuit board 12. Also shown in FIG. 5, there may be two first support members 54 that do not directly face any third support members 58. While two third support members 58 are shown positioned between two first support members 54 a single third support member 58 could be provided between two first support members 54. It is alternatively possible to provide one or two first support members 54 positioned between two third support members 58.

Figure 8:
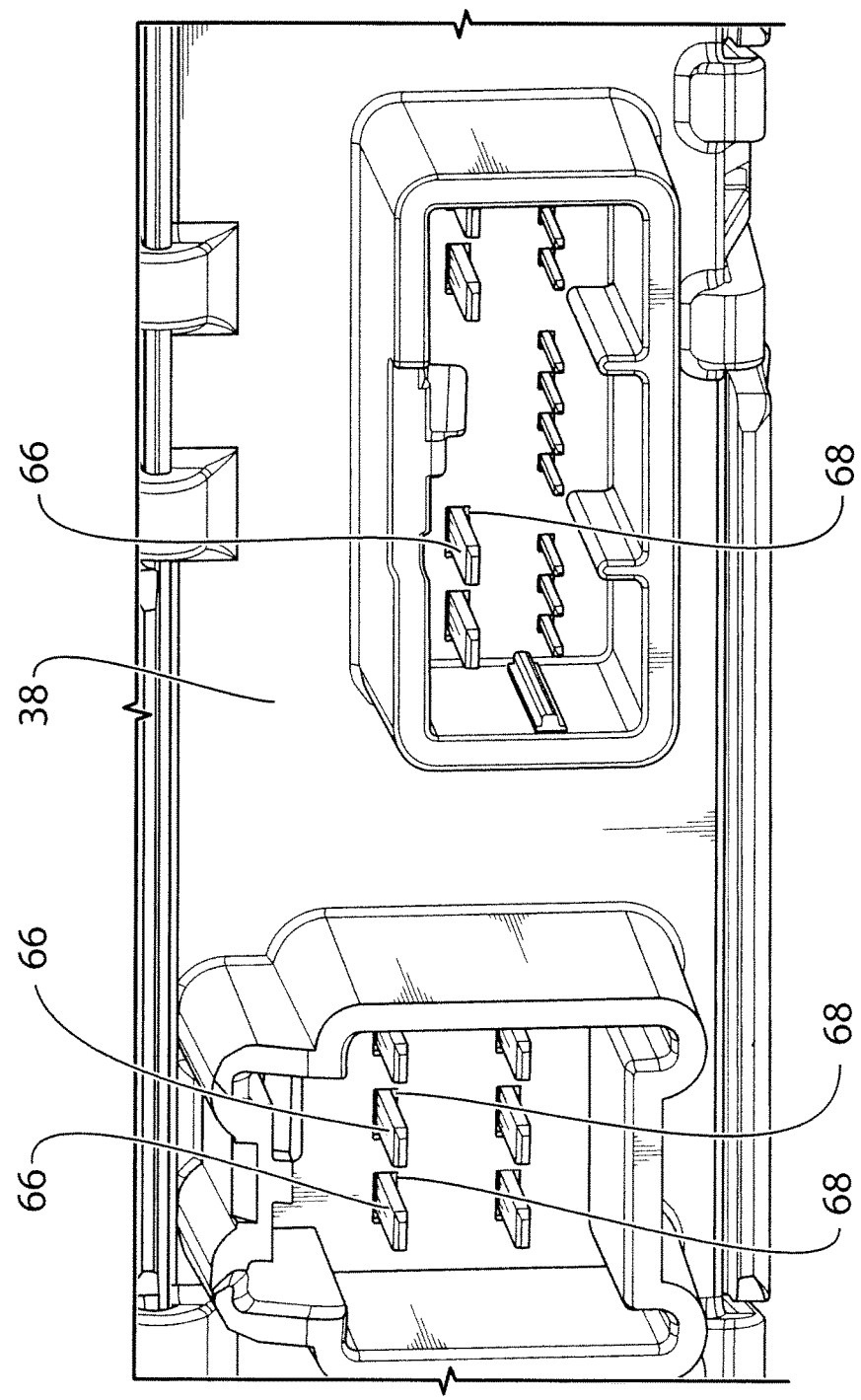
FIG. 8 is a magnified view of a portion of the enclosure showing terminals from the circuit board shown in FIG. 2 passing through apertures in the enclosure.

The second and fourth support members 56 and 60 and in particular the second support members 56a and 56c and the fourth support members 60a and 60c may cooperate in a manner whereby the second end 64 of the circuit board 12 is fixedly captured with no clearance. This may be achieved by manufacturing the first and second enclosure members 36 and 38 so that there is a spacing of the fourth support members 60a and 60c from the support plane P that is less than the thickness T of the circuit board 12. During assembly of the first and second enclosure members 36 and 38 together, there may be sufficient flexing in one or both of the enclosure members 36 and 38 for the second and fourth support members 56a and 56c and 60a and 60c to spread apart to accommodate the circuit board 12 therebetween. Thus, both ends 62 and 64 of the circuit board 12 are captured fixedly so as to prevent rattling of the circuit board 12 during operation of the vehicle. In addition to preventing rattling of the circuit board 12, the second and fourth support members 56 and 60 (in particular the fourth support members 60) provide the circuit board 12 with a selected positional relationship with the second enclosure member 38 in a direction $DIR_N$ that is normal to the plane of the circuit board 12 and normal to the plane of support P for the circuit board 12. As a result, terminals shown at 66 (FIG. 2) that extend from the terminal blocks 22, 24 and 26 are aligned in the normal direction with apertures 68 (FIG. 8) in the second enclosure member 38. FIG. 4 shows some terminals extending up from the circuit board 12 and with the terminal blocks 22, 24 and 26 omitted.

Additionally, the second enclosure member 38 may further include a second lateral locating feature 70 that is positioned to engage the first lateral locating feature 34 on the circuit board 12 so as to provide a selected positional relationship between the circuit board 12 and the second enclosure member 38 in the lateral direction (i.e. the second lateral locating feature 70 locates the circuit board 12 laterally relative to the second enclosure member 38). By doing this, the terminals 66 (FIG. 2) are laterally aligned with the apertures 68 (FIG. 8) in the second enclosure member 38. By aligning the terminals 66 with the apertures 68 in both the lateral and the normal directions, the terminals 66 are positioned to pass through the apertures 68 without colliding with the wall (shown at 72) of the second enclosure member 38 during assembly of the first and second enclosure members 36 and 38 together.

It will also be noted that, by providing the apertures 68 on the second enclosure member 38, a greater degree of observation (either by a human assembler or by through machine vision by a robotic assembly system) can be carried out as the terminals 66 approach insertion into and through the apertures 68. As a result, if it is observed that one or more of the terminals 66 are not properly aligned with the associated aperture 68, the insertion process can be halted so that the problem can be inspected further and perhaps rectified (e.g. by straightening out a terminal 66 that because inadvertently bent during manufacture of the circuit board 12). By contrast, in some prior art enclosures, the apertures are provided on a wall that is analogous to the fifth wall 48 of the enclosure 14, and the terminals extend longitudinally from a first end of the prior art circuit board (i.e. the end that is inserted to the blind end of the prior art enclosure).

On the fifth wall 48 may be provided crush members 74 that are crushed by the first end 62 of the circuit board 12 once the first and second enclosure members 38 are joined together, thereby eliminating any longitudinal play in the circuit board 12 thereby eliminating another potential source of rattling that can occur in some prior art enclosures. The crush members 74 may be made from a material that is selected to be softer than the material of the circuit board 12 thereby ensuring that the crush members 74 crush instead of damaging the circuit board 12. While the crush members 74 are shown to be positioned on the fifth wall 48, it is alternatively possible for crush members 74 to be positioned on the wall 72 of the second enclosure member 38 (i.e. the wall that faces the fifth wall 48) so as to engage an opposing portion of the edge 32 of the circuit board 12 (i.e. to engage the face of the edge 32 that is at the second end 64 of the circuit board 12 instead of the face of the edge 32 that is at the first end 62).

It will be noted that, in some prior art enclosures, a circuit board having first and second longitudinal ends is supported along continuous lines of contact with support members that extend substantially all of the way between the first and second ends. By contrast, the first and second support members 54 and 56 in the first enclosure member 36 are (longitudinally) spaced from each other, which frees up surface area on the circuit board 12 that can be used to hold components. As a result, the size of the circuit board 12 can be smaller than a circuit board being held in a prior art enclosure while still holding the same number of components. As a result of its smaller size, the cost of the circuit board 12 may be lower than the cost of a circuit board held in a prior art enclosure. Additionally, the enclosure 14 may be smaller than some prior art enclosures that hold the larger prior art circuit boards. A smaller enclosure may be less expensive and may be easier to fit in the crowded space in the engine compartment of some modern vehicles.

Figure 9:
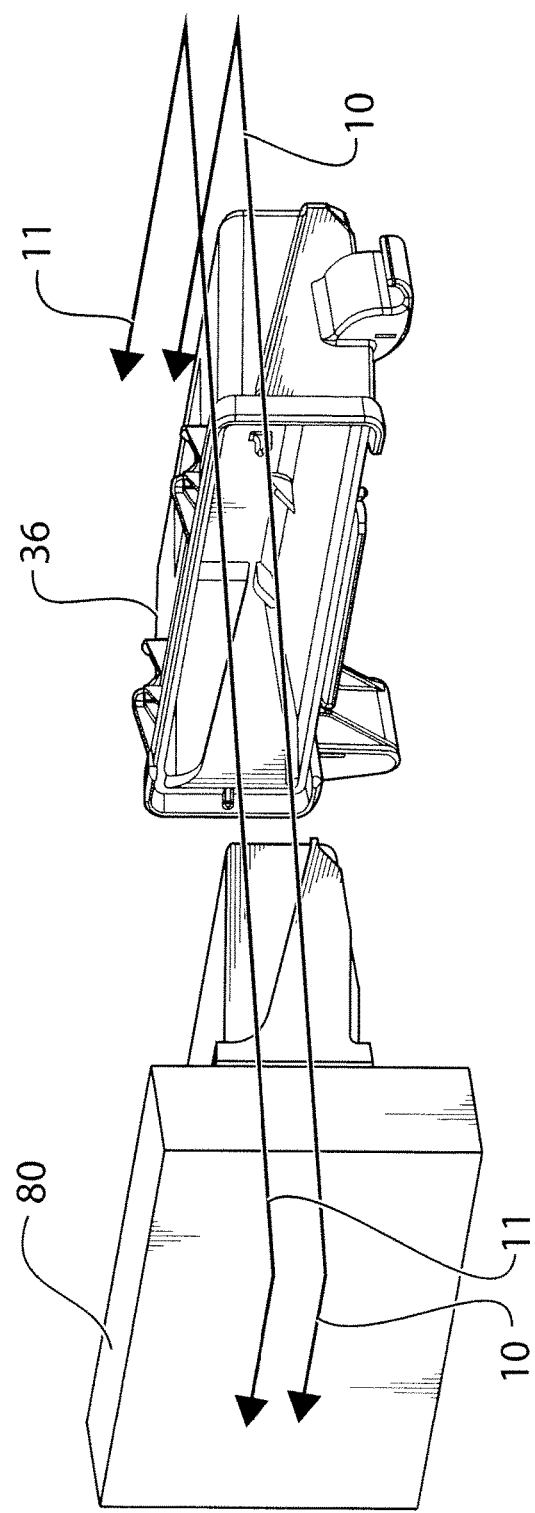
FIG. 9 is a perspective view of a portion of the enclosure shown in FIG. 1a, and a mold core used in the molding process to form the portion of the enclosure.
Figure 10A:
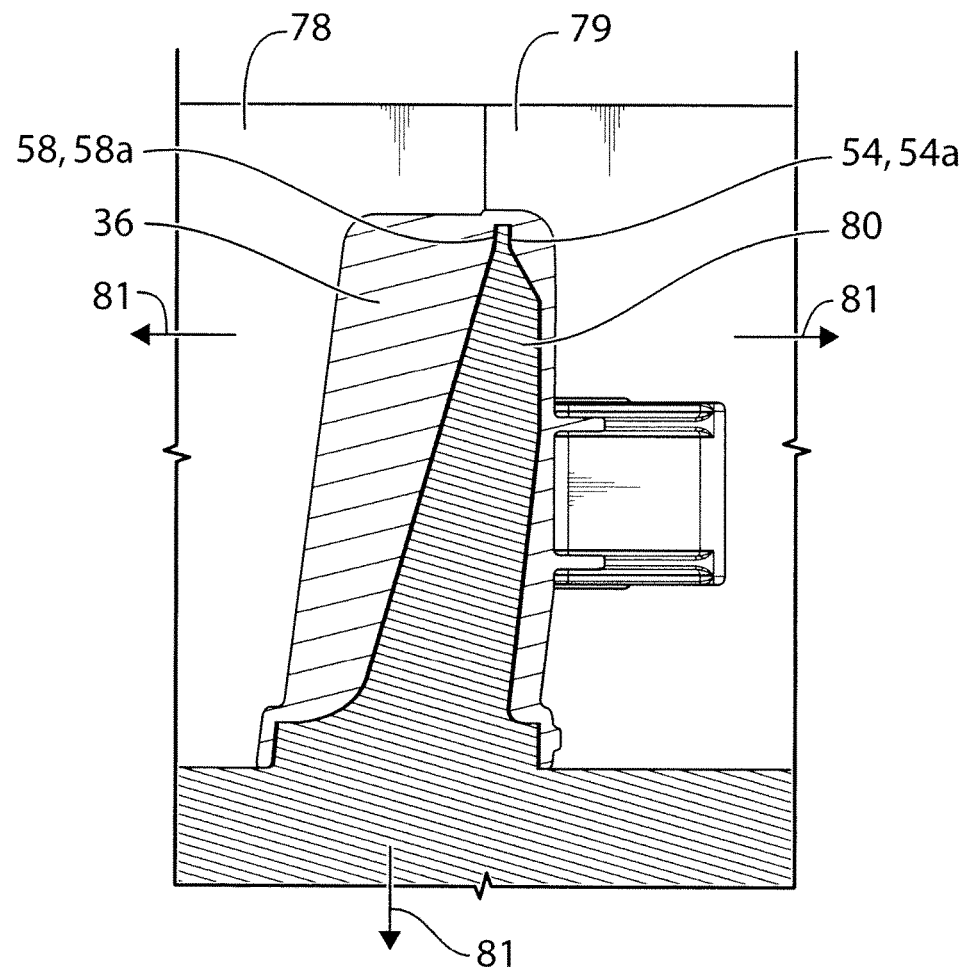
FIGS. 10a-10e are sectional side views taken along section 10-10 in FIG. 9, illustrating the withdrawal of the mold core from the portion of the enclosure.
Figure 10B:
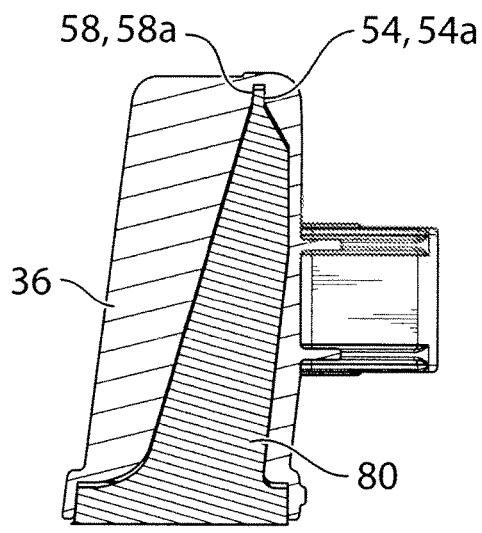
Figure 10C:
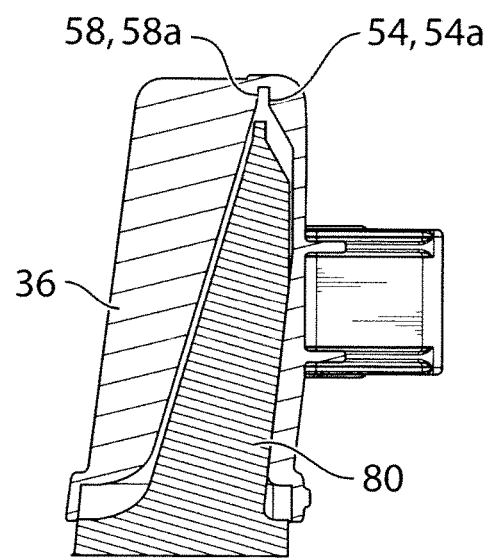
Figure 10D:
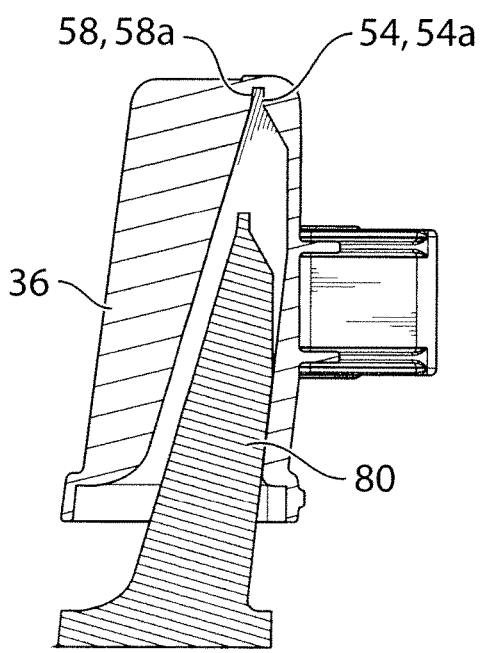
Figure 10E:
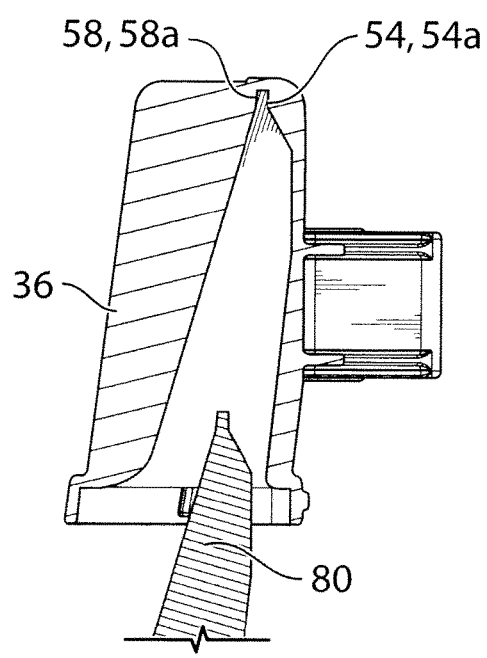
Figure 11A:
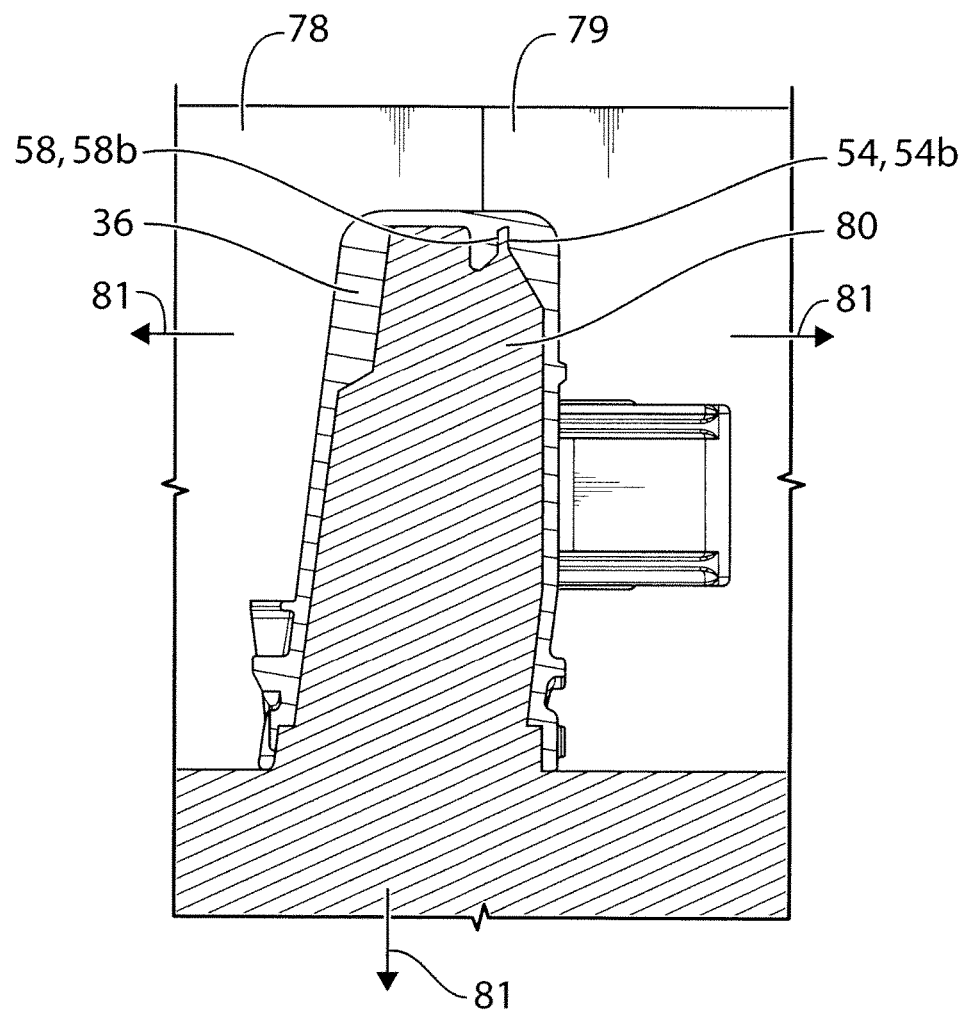
FIGS. 11a-11e are sectional side views taken along section 11-11 in FIG. 9, illustrating the withdrawal of the mold core from the portion of the enclosure.
Figure 11B:
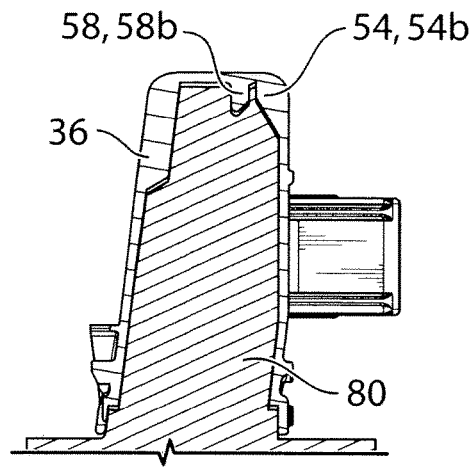
Figure 11C:
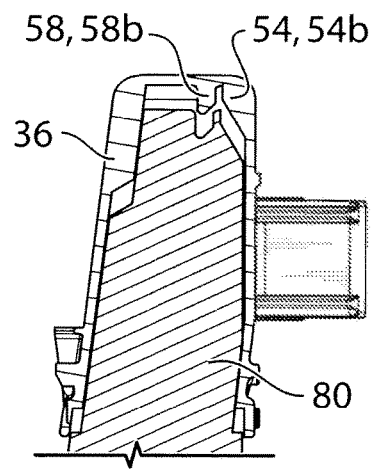
Figure 11D:
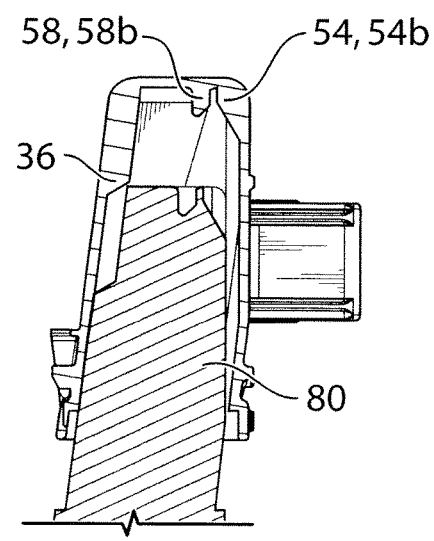
Figure 11E:
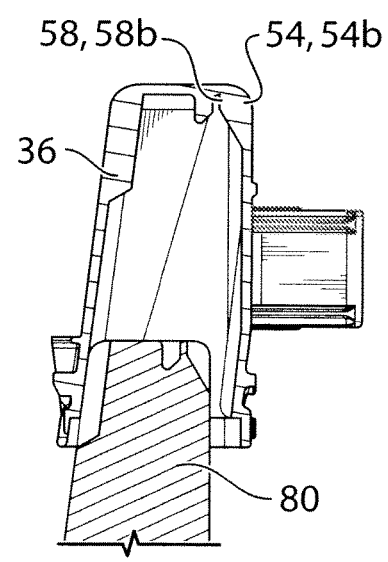

The first enclosure member 36 may be manufactured using a molding apparatus that includes a mold 77 formed by a plurality of mold plates, which include outer plates 78 and 79 and mold core 80 shown in FIG. 9. The movement of the mold plates 78, 79 and 80 to separate to eject the molded first enclosure member 36 is shown by arrows 81. The first enclosure member 36 may be configured to be moldable without creating die lock with the mold core 80. FIGS. 10a-10e illustrate the withdrawal of the mold core 80 from the interior 52, along section 10-10 in FIG. 9. FIGS. 11a-11e illustrate the withdrawal of the mold core 80 from the interior 52 along section 11-11 in FIG. 9. As can be seen, the mold core 80 is removable in a simple linear withdrawal movement.

To permit the first enclosure member 36 to be formed without creating die lock with the mold core 80, the first and second walls 40 and 42 are spaced apart by a distance that increases in a direction towards the opening 50, and any surfaces in the interior 52 of the first enclosure member 36 that at least partially face the second wall 42 have a distance $D_N$ (shown at several different points in FIG. 4) from the second wall 42 that does not decrease in a direction towards the opening 50. The interior 52 is also free of surfaces that face the fifth wall 48 and are perpendicular to the second wall 42.

An advantage of the enclosure 14 is that have improved resistance to infiltration by water relative to some enclosures of the prior art. To provide this improved resistance, the first, second, third and fourth walls 40, 42, 44 and 46 of the first enclosure member 36 extend past the wall 72 of the second enclosure member 38 that covers the opening 50. Additionally, as noted above, the apertures 68 through which the terminals 66 pass from the second enclosure member 38 pass through the wall 72 of the second enclosure member 38. Thus, when the assembly 10 is oriented so that the wall 48 of the first enclosure member 36 is at the top and the second enclosure member 38 faces downwardly the overhang provided by the first, second, third and fourth walls 40, 42, 44 and 46 inhibits water from traveling to the contact area between the wall 72 of the second enclosure member 38 and the first, second, third and fourth walls 40, 42, 44 and 46 of the first enclosure member 36.

In the embodiment shown, the wall 72 (FIG. 4) of the second enclosure member 38 that covers the opening 50 is substantially planar. Other shapes for the wall 72 are possible however. Similarly the first, second, third, fourth and fifth walls 40, 42, 44, 46 and 48 of the first enclosure member 36 may be substantially planar. Alternatively, a portion of, or the entirety of, one or more of the walls 40, 42, 44, 46 and 48 may have a shape that is other than planar, such as, for example, arcuate.

Referring to the figures and the description above, a method is provided for forming the first enclosure member 36. The method includes providing a mold formed from a plurality of mold plates (e.g. plates 78, 79 and 80) including a mold core (plate 80). The method further includes molding the enclosure member 36 in the mold around the mold core 80. As noted above, the enclosure member 36 includes a plurality of walls including the first wall 40 and the second wall 42, wherein the first and second walls 40 and 42 mutually face each other, third and fourth walls 44 and 46 that connect the first and second walls 40 and 42 to each other and that mutually face each other, and the fifth wall 48 that faces an opening 50 defined by the first, second, third and fourth walls 40, 42, 44 and 46. The longitudinal axis $A_{LONG}$ extends between the fifth wall 48 and the opening 50. The plurality of walls define an interior 52, and first and second support members 54 and 56 that face the second wall 42. The second support member 56 is longitudinally spaced from the first support member 54. The first and second walls 40 and 42 are spaced apart by the distance $D_N$ which increases towards the opening so that there is no die lock between the mold core 80 and the enclosure member 36. In another step, the method includes withdrawing the mold core 80 from the enclosure member 36 after the enclosure member 36 has been molded.

In some embodiments, compliant pin technology may be used, wherein the terminals 66 are stitched directly into the circuit board 12 without using a terminal block to hold a bank of terminals 66.

The above-described embodiments are intended to be examples only, and alterations and modifications may be carried out to those embodiments by those of skill in the art.

The invention claimed is:

1. An enclosure member for holding a controller including a circuit board with components mounted thereto, comprising:
   a plurality of walls including a first wall and a second wall, wherein the first and second walls face each other, third and fourth walls that connect the first and second walls to each other and that face each other, and a fifth wall that faces an opening defined by the first, second, third and fourth walls, wherein the plurality of walls define an interior, wherein a longitudinal axis extends between the fifth wall and the opening; and
   at least one first support member and at least one second support member, wherein the first and second support members extend outwardly from the first wall into the interior and face the second wall, wherein the at least one second support member is spaced longitudinally toward the opening from the at least one first support member, wherein the first and second walls are spaced apart by a distance that increases in a direction towards the opening.

2. An enclosure member as claimed in claim 1, further comprising at least one third support member that faces the first wall, wherein the first and second support members are positioned to support a first face of a circuit board and the at least one third support member is positioned to support a second face of the circuit board.

3. An enclosure member as claimed in claim 2, wherein the first and second support members define a support plane for the circuit board, wherein at least one of the at least one third support member is offset laterally from said at least one first support member and is spaced from the support plane by not more than the thickness of the circuit board.

4. An enclosure member as claimed in claim 2, wherein said at least one first support member includes a plurality of first support members and said at least one third support member includes a plurality of third support members and wherein at least one of the first and third support members is positioned laterally between two of the other of the first and third support members.

5. An enclosure member as claimed in claim 4, wherein at least two of the first support members are positioned laterally between two of the third support members or at least two of the third support members are positioned laterally between two of the first support members.

6. An enclosure member as claimed in claim 1, further comprising at least one crush member extending from the fifth wall towards the opening and positioned to engage an end of the circuit board facing away from the opening.

7. An enclosure for holding a controller including a circuit board with components mounted thereto, comprising:
a first enclosure member, including:
a plurality of walls including a first wall and a second wall, wherein the first and second walls mutually face each other, third and fourth walls that connect the first and second walls to each other and that mutually face each other, a fifth wall that faces an opening defined by the first, second, third and fourth walls, wherein the plurality of walls define an interior, wherein a longitudinal axis extends between the fifth wall and the opening;
at least one first support member and at least one second support member, wherein the first and second support members extend outwardly from the first wall into the interior and face the second wall, wherein the second support member is spaced longitudinally from the first support member, wherein the first and second walls are spaced apart by a distance that increases towards the opening; and
a second enclosure member that mates with the first enclosure member to cover the opening.

8. An enclosure as claimed in claim 7, wherein the first enclosure member further comprises at least one third support member that faces the first wall, wherein the first and second support members are positioned to support a first face of a circuit board and the at least one third support member is positioned to support a second face of the circuit board,
and wherein the second enclosure member includes at least one fourth support member that faces the first wall and that is positioned to support the second face of the circuit board.

9. An enclosure as claimed in claim 7, wherein a crush member is provided on at least one of the fifth wall and a wall of the second enclosure member facing the fifth wall, wherein the crush member is positioned to be compressed by an edge of the circuit board in order for the circuit board to fit between the wall of the second enclosure member and the fifth wall.

10. An enclosure as claimed in claim 7, wherein the second enclosure member includes a plurality of apertures, with each of the apertures being positioned and sized for the insertion of an associated one of a plurality of terminals from the circuit board therethrough.

11. An enclosure for holding a controller including a circuit board with components mounted thereto, comprising:
a first enclosure member, including a plurality of walls including a first wall and a second wall, wherein the first and second walls mutually face each other, third and fourth walls that connect the first and second walls to each other and that mutually face each other, and a fifth wall that faces an opening defined by the first, second, third and fourth walls, wherein the plurality of walls define an interior, at least one second support member extending outwardly from the first wall, adjacent the opening, into the interior and facing the second wall to support a first face of the circuit board; and
a second enclosure member that mates with the first enclosure member to cover the opening, wherein the second enclosure member includes a plurality of apertures positioned and sized for the insertion of a plurality of terminals from the circuit board therethrough, at least one fourth support member on the second enclosure member configured to face the first wall and to support a second face of the circuit board to inhibit lateral movement of the circuit board between the at least one second support member and the at least one fourth support member.

12. An enclosure as claimed in claim 11, wherein the first, second, third and fourth walls extend past a wall of the second enclosure member that covers the opening.

13. An enclosure as claimed in claim 11, wherein the second enclosure member covers the opening with a substantially planar wall.

14. An enclosure as claimed in claim 11, wherein the second enclosure member connects to the first enclosure member by at least one snap-fit connection.

15. An enclosure as claimed in claim 7, wherein the second enclosure member connects to the first enclosure member by at least one snap-fit connection.

16. An enclosure as claimed in claim 7, wherein the second enclosure member includes a second lateral locating feature configured to locate the circuit board laterally relative to the second enclosure member.

17. An enclosure as claimed in claim 11, further including at least one first support member extending outwardly from the first wall of the first enclosure member into the interior and facing the second wall, wherein the at least one second support member is spaced longitudinally toward the opening from the at least one first support member.

* * * * *